US011415639B2

(12) United States Patent
Kelly et al.

(10) Patent No.: US 11,415,639 B2
(45) Date of Patent: Aug. 16, 2022

(54) PORTABLE INTERMITTENT FAULT DETECTOR

(71) Applicant: Universal Synaptics Corporation, Roy, UT (US)

(72) Inventors: Patrick B. Kelly, Roy, UT (US); Jayson Kelly, Roy, UT (US)

(73) Assignee: Universal Synaptics Corporation, Roy, UT (US)

( * ) Notice: Subject to any disclaimer, the term of this patent is extended or adjusted under 35 U.S.C. 154(b) by 0 days.

(21) Appl. No.: 17/001,644

(22) Filed: Aug. 24, 2020

(65) Prior Publication Data

US 2021/0109163 A1 Apr. 15, 2021

Related U.S. Application Data

(60) Provisional application No. 62/891,266, filed on Aug. 23, 2019.

(51) Int. Cl.
| *G01R 31/52* | (2020.01) |
| *G01R 31/00* | (2006.01) |
| *G01R 31/54* | (2020.01) |
| *G01R 31/69* | (2020.01) |

(52) U.S. Cl.
CPC ........... *G01R 31/52* (2020.01); *G01R 31/008* (2013.01); *G01R 31/54* (2020.01); *G01R 31/69* (2020.01)

(58) Field of Classification Search
CPC .. G01R 31/08; G01R 31/11; G01R 31/50–74; G01R 31/005–008
See application file for complete search history.

(56) References Cited

U.S. PATENT DOCUMENTS

| 3,986,106 A | * | 10/1976 | Shuck | G01R 31/60 |
| | | | | 324/540 |
| 4,227,146 A | * | 10/1980 | Hodge | G01R 31/50 |
| | | | | 324/541 |
| 4,959,792 A | * | 9/1990 | Sullivan | G01R 31/58 |
| | | | | 324/555 |

(Continued)

FOREIGN PATENT DOCUMENTS

| CN | 106707103 A | * | 5/2017 | ........... G01R 31/024 |
| DE | 102009037445 A1 | * | 2/2011 | ............. G01R 31/02 |

(Continued)

*Primary Examiner* — Patrick Assouad
*Assistant Examiner* — Demetrius R Pretlow
(74) *Attorney, Agent, or Firm* — Dentons Durham Jones Pinegar (57) ABSTRACT

A portable intermittent fault detector includes an enclosure that carries electronics and a display. The electronics are selected, arranged, and connected in a manner that minimizes noise, including noise that could interfere with an ability of the portable intermittent fault detector to detect intermittent faults in complex electrical systems. The portable intermittent fault detector also includes a passive heat management system hat conveys heat away from the electronics. In addition, a test module assembly of the portable intermittent fault detector includes an inner assembly with test module boards that are rigidly secured to one another and an outer support that carries the inner assembly in a manner that absorbs impacts and other forces on the portable intermittent fault detector.

12 Claims, 4 Drawing Sheets

(56) References Cited

U.S. PATENT DOCUMENTS

| | | | | |
|---|---|---|---|---|
| 5,155,440 | A * | 10/1992 | Huang | G01R 31/58 |
| | | | | 324/66 |
| 5,227,984 | A * | 7/1993 | Meldrum | G01R 31/50 |
| | | | | 324/522 |
| 5,446,389 | A * | 8/1995 | Lenz | G01R 31/008 |
| | | | | 73/114.61 |
| 5,744,967 | A | 4/1998 | Sorensen | |
| 6,344,748 | B1 * | 2/2002 | Gannon | G01R 31/69 |
| | | | | 324/543 |
| 8,103,475 | B2 | 1/2012 | Sorensen | |
| 8,711,711 | B2 * | 4/2014 | Kim | H04L 25/0268 |
| | | | | 370/242 |
| 9,684,037 | B2 * | 6/2017 | Hardy | B60L 53/63 |
| 10,641,826 | B2 | 5/2020 | Kelly et al. | |
| 2007/0001683 | A1 * | 1/2007 | Krigel | G01R 31/58 |
| | | | | 324/538 |
| 2009/0079419 | A1 * | 3/2009 | Lui | G01R 31/2889 |
| | | | | 324/762.02 |
| 2009/0212964 | A1 * | 8/2009 | Hibma | G01R 19/16547 |
| | | | | 340/657 |
| 2010/0174522 | A1 * | 7/2010 | Stunkel | G01R 31/008 |
| | | | | 703/17 |
| 2010/0268507 | A1 * | 10/2010 | Sorensen | G01R 31/58 |
| | | | | 702/120 |
| 2011/0050244 | A1 * | 3/2011 | Knoop | G01R 31/008 |
| | | | | 324/503 |
| 2017/0102409 | A1 * | 4/2017 | Sarhad | G01R 31/31905 |
| 2017/0153283 | A1 * | 6/2017 | Gontier | G01R 31/11 |
| 2020/0124656 | A1 * | 4/2020 | Layer | G01R 31/088 |

FOREIGN PATENT DOCUMENTS

| | | | | |
|---|---|---|---|---|
| KR | | 101915457 B1 * | 11/2018 | |
| WO | WO-2004070398 A2 * | | 8/2004 | G01R 31/021 |

* cited by examiner

PORTABLE INTERMITTENT FAULT DETECTOR

CROSS-REFERENCE TO RELATED APPLICATION

A claim for priority to the Aug. 23, 2019 filing date of U.S. Provisional Patent Application No. 62/891,266, titled PORTABLE INTERMITTENT FAULT DETECTOR, is hereby made pursuant to 35 U.S.C. § 119(e) ("the '266 Provisional Application"). The entire disclosure of the '266 Provisional Application is hereby incorporated herein.

TECHNICAL FIELD

This disclosure relates generally to electronic devices and, more specifically, to portable electronic devices. Even more specifically, this disclosure relates to electrical testers, including testers that can detect faults in electrical systems, such as the complex electrical systems of aircraft. More particularly, this disclosure relates to portable electrical fault detectors, including portable intermittent fault detectors.

RELATED ART

A variety of sophisticated vehicles, including, without limitation, airplanes, helicopters, unmanned aerial vehicles (UAVs), rockets, satellites, ships, tanks, and autonomous ground vehicles, utilize complex electronic systems for control, guidance, and other mission-critical purposes. It is imperative that all of the components and connectors of such electronic systems function reliably. Nevertheless, electrical connections between the components of electrical systems are known to degrade over time, causing the electrical systems of which they are a part to malfunction. The delicate electronic components are also subject to degradation and other types of damage. Faults in and failure of a vehicle's electrical systems and the consequent malfunction of the vehicle can result in damage or loss to the vehicle, as well as loss of life, both of which are very costly.

Degradation curves of electromechanical components suggest that intermittence, or an intermittent fault—a state where a circuit experiences brief fluctuations in resistance—is an early indicator of failure in electrical systems. Intermittence occurs randomly in time, duration, and amplitude.

While constant faults are relatively easy to diagnose and repair, intermittent failures are random in nature and, thus, are extremely difficult to detect, isolate, and resolve. Conventional attempts to detect intermittent faults are generally performed using serial test methods, which employ automatic wire testers (AWTs), digital multimeters (DMMs), or time domain reflectometry (TDR) to serially scan and/or test one line or circuit at a time to measure the ohmic continuity of the circuit—even when thousands of circuits are involved. In complex electrical systems with multiple circuits, the odds that a random, elusive intermittent fault will occur in a failing circuit at the exact moment a serial test method is used to scan that circuit are infinitesimally small. Thus, although serial test methods provide stable readings from circuits with constant faults, they have proven fundamentally ineffective for detecting randomly occurring, low-level, intermittent faults.

Oscilloscopes are generally able to detect intermittent faults; however, oscilloscopes are only useful for testing one circuit at time. Thus, they are not useful for testing for intermittent faults in complex electrical systems with multiple circuits. In addition, oscilloscopes require that an electrical stimulus be applied to the circuit under test, making them largely impractical and unsuitable for complex electrical systems that include hundreds or thousands of circuits and connection points.

Universal Synaptics Corporation (USC) has developed a diagnostic system, the IFDIS 2.0, that can interface with a complex electrical system in increments of up to 1,280 electrical connection points. The IFDIS 2.0 diagnostic system can independently, simultaneously, and continuously monitor all of the circuits to which it is connected (each, a unit under test (UUT) circuit) to detect any intermittent faults that may occur, including intermittent faults that are as short as 50 nanoseconds (0.00000005 seconds) in duration. The IFDIS 2.0 diagnostic system can also automatically interrogate and store the as-designed wiring configuration for a good unit, and then, based on that configuration, detect any open, short, ohmic, impedance, drift, or miswiring problems in subsequent UUT circuits. Various features of the IFDIS 2.0 diagnostic system are disclosed by U.S. Pat. No. 5,744,967 ("the '967 Patent") and U.S. Pat. No. 8,103,475 ("the '475 Patent") and U.S. Pat. No. 10,641,826 ("the '826 Patent"), the disclosures of each of which are hereby incorporated herein. While the IFDIS 2.0 diagnostic system detects intermittent faults in complex electrical systems with a high degree of accuracy, it is also very expensive.

Universal Synaptics Corporation has attempted to address the need for less expensive diagnostic systems that can accurately detect intermittent faults by designing, building prototypes of, and testing smaller, more portable diagnostic systems, which USC refers to as the VOYAGER portable diagnostic system. Prototypes of the VOYAGER portable diagnostic system employ the same technology as the IFDIS 2.0 diagnostic system, with fewer possible connections (including a 256 connection version and a 512 connection version). Despite its incorporation of effective, state-of-the-art intermittent fault detection technology, as demonstrated through repeated testing, design issues in various iterations of the prototypes of the VOYAGER portable diagnostic system have led to quality issues that have prevented its commercialization.

In particular, the small form factor of the various prototypes of the VOYAGER portable diagnostic system led to temperature management issues, power management issues, and the generation of noise (i.e., unwanted disturbances in electrical signals; electromagnetic interference (EMI)). Active movement of the heat generated by electronic components of prototypes of the VOYAGER portable diagnostic system circulate the heat back onto those electronic components while generating additional heat. Complex power management systems add to the overall heat and noise generated by the prototypes of the VOYAGER portable diagnostic system, while failing to supply constant voltages to the electronic components of the portable diagnostic system. The numerous electronic components and the use of long ribbon connectors (e.g., up to about 15 inches (38.1 cm) in length) generate undesirable levels of noise, which was addressed by lining the enclosures of later prototypes of the VOYAGER portable diagnostic system with copper, adding to their complexity and expense.

In addition, the portability of the various prototypes of the VOYAGER portable diagnostic system and the impacts that occur while transporting them, in combination with the manner in which test modules of the portable diagnostic system are assembled, have resulted in undesirable mechanical failure rates and the concomitant increased likelihood of damage to the relatively delicate test modules of the prototype portable diagnostic systems. The undesirable mechanical failure rates are believed to result from flexibility in the manner in which the boards that carry the test modules were assembled with each other and with other components (e.g., a chassis, etc.) of the VOYAGER portable diagnostic system. That flexibility is believed to allow the boards and other electronic components to move relative to another in a manner that stresses and causes failure in electrical connections between the electrical components.

SUMMARY

Various improvements to and features of portable diagnostic systems are disclosed. The portable diagnostic systems may include intermittent fault detectors, including, but not limited to, intermittent fault detectors that incorporate at least some of the same technologies that are disclosed by the '967 Patent, the '475 Patent, and/or the '826 Patent and/or that are employed by the IFDIS 2.0 diagnostic system.

In one aspect, a portable diagnostic system according to this disclosure may passively transfer heat away from the electronic components of the portable diagnostic system. In another aspect, a portable diagnostic system according to this disclosure may include a switchable power supply. According to another aspect, the electronic components of a portable diagnostic system may be arranged in a manner that reduces or eliminates noise generated by the portable diagnostic system. In yet another aspect, a configuration of the portable diagnostic system may limit the forces to which the delicate test modules of the portable diagnostic system may be exposed.

A portable diagnostic system according to this disclosure may include an enclosure, a chassis, and electronic components carried by the chassis, with the chassis and at least some of the electronic components having configurations that facilitate passive heat dissipation.

The enclosure may include a base, or bottom portion, and a lid, or top portion. The base of the enclosure may carry the chassis and many of the electronic components of the portable diagnostic system, including, but not limited to, a power supply, a computer, and a test module assembly. In addition, a cover may be positioned over an opening in the base of the enclosure and the contents of the enclosure (e.g., the chassis, the electronic components carried by the chassis, etc.), and carry diagnostic connectors that establish connection points to the test modules of the test module assembly. The lid of the enclosure may carry a display and controls for the portable diagnostic system.

The chassis and many of the electronic components may be carried by a bottom portion of the case. A configuration of the chassis, along with configurations of various electronic components carried by the chassis, may enable the chassis to passively and efficiently convey heat away from the electronic components of the portable diagnostic system. More specifically, the chassis may comprise a thermally conductive plate (e.g., an aluminum plate, etc.) that serves as a heat sink for other various components, including other thermally conductive elements of the chassis and heat-generating electronic components of the portable diagnostic system. A mass of the thermally conductive plate may enable it to absorb heat quickly from the electronic components. An area on an opposite, second side (e.g., a bottom side, etc.) of the thermally conductive plate may enable it to dissipate heat into a space between the second side of the thermally conductive plate and an interior surface of the base of the enclosure. The rate at which heat dissipates from the thermally conductive plate corresponds to the ability of the thermally conductive plate to continue absorbing heat from the electronic components of the diagnostic system without exposing the electronic components to undesirably high levels of heat.

Without limitation, the thermally conductive plate of the chassis of the portable diagnostic system may carry a main power supply, a computer, and the test module assembly of the portable diagnostic system. The thermally conductive plate may also carry a DMM (e.g., for scanning measurements, etc.). One or more of the electronic components may be oriented on the thermally conductive plate in a manner that minimizes their footprints over the first side of the thermally conductive plate. For example, one or more of a module power board, a bus adapter board, and a DMM board may be oriented perpendicularly relative to the first side of the thermally conductive plate.

A power supply of a portable diagnostic system according to this disclosure may supply power at a constant voltage or at a substantially constant voltage (e.g., within acceptable tolerances for properly operating each device to which power is supplied, etc.). As an example, the power supply may receive power at about 15 V (e.g., 9 V to 20 V, etc.) while outputting clean power at 5 V.

Noise generated by the portable diagnostic system may be minimized, substantially eliminated (e.g., by eliminating all ribbon connectors, leads, and other intermediate conductive elements as sources of noise, etc., while one or more electronic components may continue to generate noise) in a variety of ways. As an example, minimizing the number of noise-generating electronic components may reduce the overall level of noise produced by the portable diagnostic system, as may the selection of electronic components (e.g., a power supply, etc.) that generate little or no noise, or that are substantially noise-free. As another example, the lengths of all of the power leads and ribbon connectors of the portable diagnostic system may be minimized. The length of each lead and/or ribbon connector may be short enough to prevent it from acting as a quarter wavelength antenna, which may reduce edges in waveforms of the signals transmitted by the leads and/or conductive elements of the ribbon connectors, and, therefore, may eliminate the generation and/or transmission of noise, or EMI. Each ribbon connector of the portable diagnostic system may have a length of about 4 inches (10.2 cm) or less or even a length of about 3 inches (7.6 cm) or less. The electronic components of the portable diagnostic system may be oriented and arranged in a manner that minimizes the length of each ribbon connector, and which may minimize the collective lengths of all of the ribbon connectors. Additionally, the electronic components of the portable diagnostic system may be oriented and arranged in a manner that provides for direct connections between electronic components, and, thus, eliminates the need for folding any ribbon connector at a non-straight angle, such as a right angle or an approximate right angle, etc.).

The test module assembly may absorb forces applied thereto, including, without limitation, forces that may be generated as the enclosure experiences impacts with other objects (e.g., as it is dropped, as other objects slide against it or fall on it, etc.), while isolating the delicate electronic components and features of the test module assembly from those forces. These delicate electronic components and features may include the circuit boards that carry the test modules, the connections between the circuit boards and the test modules, the test modules themselves, and the connections between the test modules and the ribbon connectors that connect the test modules to their respective diagnostic connectors (e.g., standard electrical connectors, such as 50 position D-sub connectors, etc.).

As an example, the test module assembly may absorb impacts and other forces in a manner that limits the gravitational force equivalents, or g-forces (go), experienced by its circuit board, test modules, and connections to non-damaging levels (i.e., g-forces that these delicate components and features are known to be able to withstand). The test module assembly may be capable of absorbing impacts and other forces that generate a g-force of 20 go or more, while the delicate components and features of the test module assembly experience a g-force of about 10 go or less. In a specific embodiment, a configuration of the test module assembly may enable the portable diagnostic system to experience g-forces of up to 20 go while limiting the g-forces experienced by the delicate electronic components and features of the test module assembly to experience a g-force of 10 go or less. In such an embodiment, the delicate electronic components and features of the test module assembly may be able to withstand repeated drops of the portable diagnostic system from a height of up to four (4) feet.

The test module assembly may include an outer support, an inner frame, and a plurality of isolators between the outer support and the inner frame. The outer support may comprise a rigid structure. The inner frame may also comprise a rigid structure. These elements may be arranged in such a way that the inner frame and the circuit boards and test modules it carries may float relative to the outer support and, thus, relative to the chassis and the enclosure of the portable diagnostic system. For example, the isolators may non-rigidly secure the inner frame and, thus, the inner assembly of the test module assembly to the outer support of the test module assembly and, in some embodiments, to the chassis and/or the enclosure of the portable diagnostic system. Each isolator, as well as the distances between the outer surfaces of the inner assembly and inner surfaces of the outer support, the chassis, and the cover that oppose, or face, the outer surfaces of the inner assembly, may enable the inner assembly to travel in any direction within the outer support.

Test module boards of the test module assembly may be assembled with the inner frame and with one another in a manner that enhances the rigidity and/or the impact resistance of an inner assembly of the test module assembly. As an example, the inner frame may at least partially surround an outer periphery of a plurality of test module boards that are superimposed, or stacked, relative to one another in a spaced apart relation to each other. The boards of the inner assembly may be rigidly secured to the inner frame. Spacers may separate adjacent test module boards from each other, but rigidly secure them to each other.

Other aspects of the disclosed subject matter, as well as features and advantages of various aspects of the disclosed subject matter, will become apparent to those of ordinary skill in the art through consideration of this disclosure and the appended claims.

DETAILED DESCRIPTION

Figure 1:
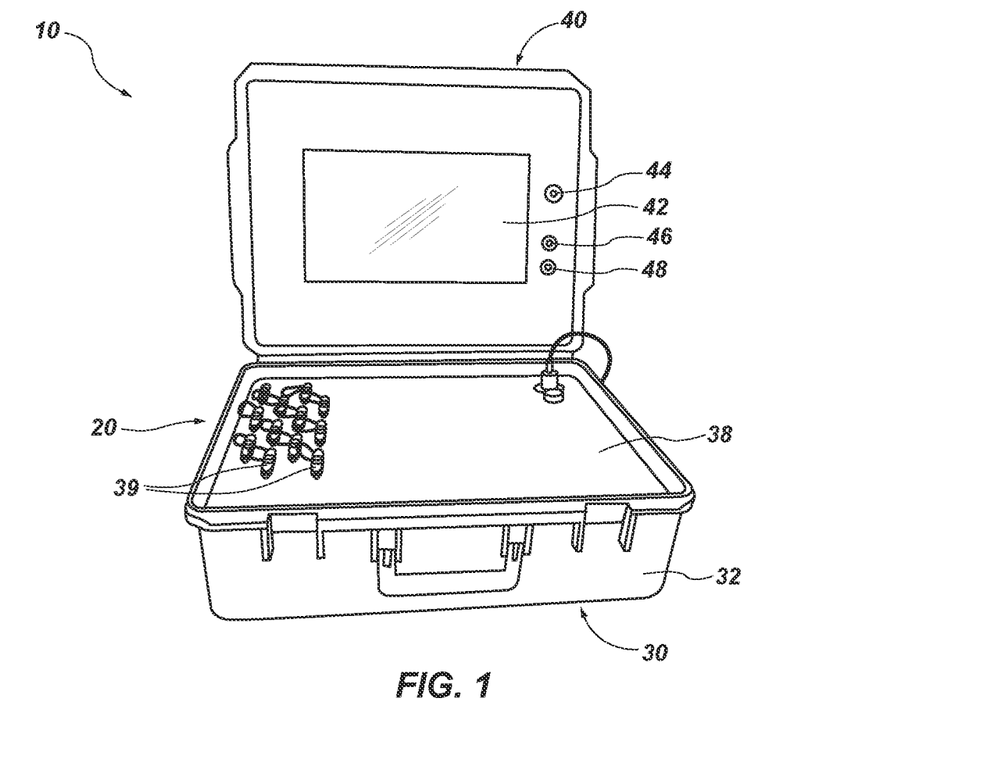
FIG. 1 illustrates an embodiment of a portable diagnostic system.

As illustrated by FIG. 1, a portable diagnostic system 10 according to this disclosure may include an enclosure 20 with a base 30, or a bottom portion, and a lid 40, or a top portion. FIG. 1 shows the lid 40 in an open arrangement over the base 30. The lid 40 may also be closed over the base 30 (e.g., pivotally by way of hinges, etc.).

The enclosure 20 may comprise any suitable type of case. In some embodiments, the case may have a design (e.g., comprise a material, include at least one feature, etc.) that enables it to protect the delicate electronic components of the portable diagnostic system. In a specific embodiment, the enclosure 20 may comprise a case of the type available from Pelican Products, Inc., of Torrance, Calif. Such an enclosure 20 may comprise injected molded plastic and include a gasket that enables it to seal when the lid 40 is secured in place over the base 30. In some embodiments, the enclosure 20 may be watertight and/or airtight. The enclosure 20 may meet standards for waterproofing, stacking, impact, and durability, including the MIL STD C4150-J for waterproofing, the IEC IP67 rating indicating complete sealing against dust and water immersion to 1 meter, and the ATA 300 rating indicating compliance with Air Transport Association standards for durability in shipping. Such an enclosure 20 may include a pressure equalization valve (not shown) to prevent pressure damage to the enclosure 20 and its contents when the air pressure around the enclosure 20 changes while it is sealed shut (e.g., during transportation, etc.).

The base 30 of the enclosure 20 defines a housing 32 for a chassis (now shown in FIG. 1) and various components (also not shown in FIG. 1) carried by the chassis. As illustrated by FIG. 1, the base 30 includes a cover 38 over the housing 32 and the components therein. The cover 38 may carry a number of diagnostic connectors 39. As illustrated, the cover 38 carries twelve (12) 50 position D-sub connectors, which enable the portable diagnostic system 10 to simultaneously and continuously test 512 different connection points, or circuits. Another diagnostic connector 39 extends through the cover 38 to a display 42 carried by the lid 40 of the enclosure 20.

In addition to the display 42, the lid 40 may carry controls for the portable diagnostic system 10. As non-limiting examples, the lid 40 may carry a power button 44 and buttons 46 and 48 that control a brightness of the display 42.

Figure 2:
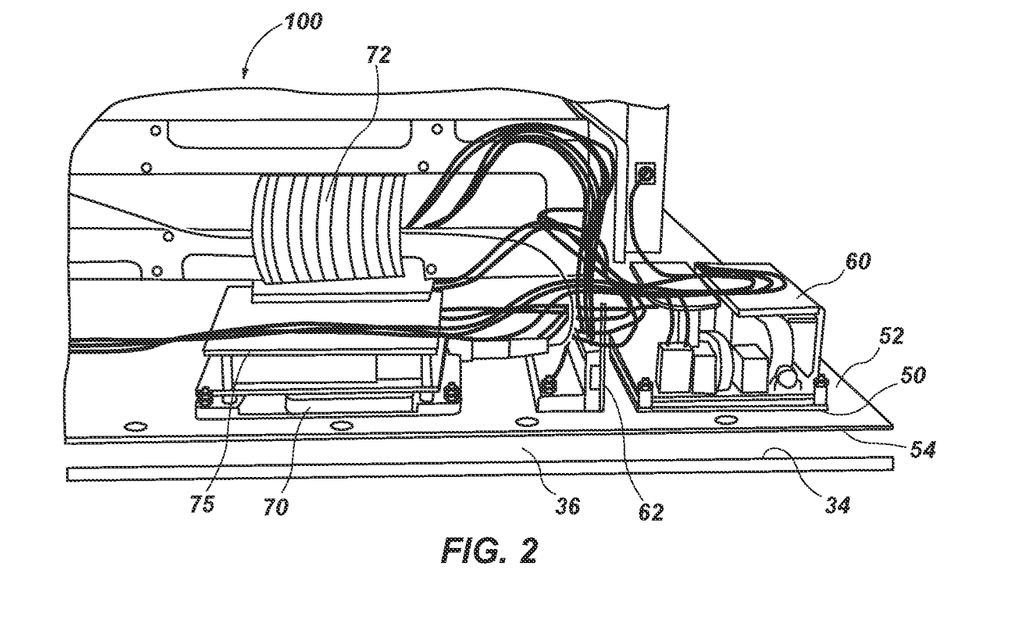
FIG. 2 illustrates various components within an interior of the portable diagnostic system shown in FIG. 1, including a thermally conductive plate of a chassis of the portable diagnostic system, a power supply, a module power board, a computer, and a ribbon connector.
Figure 3:
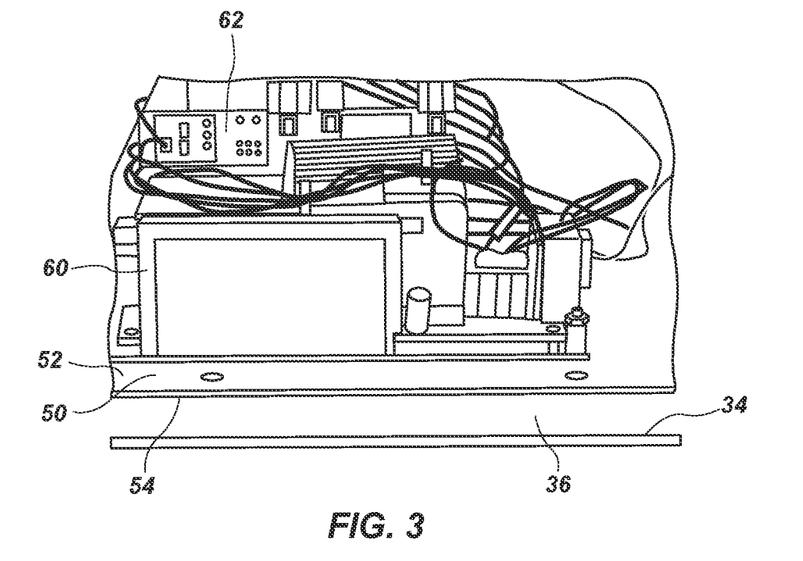
FIG. 3 provides another view of various components within the interior of the portable diagnostic system shown in FIG. 1, including the thermally conductive plate and the power supply.

Turning now to FIGS. 2 and 3, various components that may be carried within the housing 32 (FIG. 1) defined by the base 30 (FIG. 1) of the enclosure 20 (FIG. 1) are depicted. The housing 32 (FIG. 1) may carry a chassis 50. The chassis 50 may comprise a thermally conductive plate (e.g., an aluminum plate, etc.) that serves as a heat sink for various other components of the portable diagnostic system 10 (FIG. 1), including other thermally conductive elements of the chassis 50 and heat-generating electronic components carried by the chassis 50. The thermally conductive plate of the chassis 50 may extend over a majority of an area (e.g., >50%, 60%, 75%, 80%, 90%, etc.) within a bottom portion of the housing 32 defined by the base 30 of the enclosure 20. One or more heat-generating electronic components carried by the thermally conductive plate of the chassis 50 may include heat sinks. The heat sinks of such electronic components may be secured to a first side 52 (e.g., a top side, etc.) of the chassis 50 in a manner that facilitates the transfer of heat away from the electronic components and into the thermally conductive plate (e.g., with thermally conductive mounts, etc.). A mass of the thermally conductive plate may enable it to absorb heat quickly from the electronic components. An area on an opposite, second side 54 (e.g., a bottom side, etc.) of the chassis 50 may enable the thermally conductive plate to dissipate heat into a space 36 between the second side 54 of the chassis 50 and an interior surface 34 of the housing 32 defined by the base 30 of the enclosure 20. The rate at which heat dissipates from the thermally conductive plate of the chassis 50 corresponds to the ability of the thermally conductive plate to continue absorbing heat from the electronic components of the portable diagnostic system 10 (FIG. 1) without exposing the electronic components to undesirably high levels of heat.

The chassis 50 may carry various other components, including, without limitation, a main power supply 60, a computer 70, and a test module assembly 100 of the portable diagnostic system 10 (FIG. 1). A ribbon connector 72 connects the computer 70 to the test module assembly 100. The thermally conductive plate may also carry a module power board 62, a bus adapter board 75, a digital multimeter (DMM) (not shown) (e.g., for scanning measurements, etc.), and a DMM board 82. One or more of these and/or other components may be oriented on the chassis 50 in a manner that minimizes their footprints over the chassis 50. For example, one or more of the module power board 62, the bus adapter board 75, and the DMM board 82 may be oriented perpendicularly relative to the first side 52 of the chassis 50.

The power supply 60 may supply power at a constant voltage or at a substantially constant voltage (e.g., within acceptable tolerances for properly operating each device to which power is supplied, etc.). As an example, the power supply 60 may receive power at about 15 V (e.g., 9 V to 20 V, etc.) while outputting clean power at 5 V. The power supply 60 may comprise a switched-mode power supply, or a switchable power supply, such as the AC-DC power supply available from Traco Electronic AG of Baar, Switzerland as Traco Power TPP 450 115A M. The computer 70 and a module power board 62 may be associated with the power supply 60. The module power board 62 may supply power to the test module assembly 100 or, in some embodiments, to a power supply component (e.g., a 5 V power supply component, etc.) carried by a test module interface board (FIG. 4) of the test module assembly 100. The test module interface board 120 may, in turn, supply power to a test module controller 120 (not shown) and to the test modules (not shown) carried by the test module boards 140a, 140b, 140c, etc. (FIG. 5). Switchability of the power supply 60 may enable the test modules to be powered down while the computer 70 continues to run.

Figure 4:
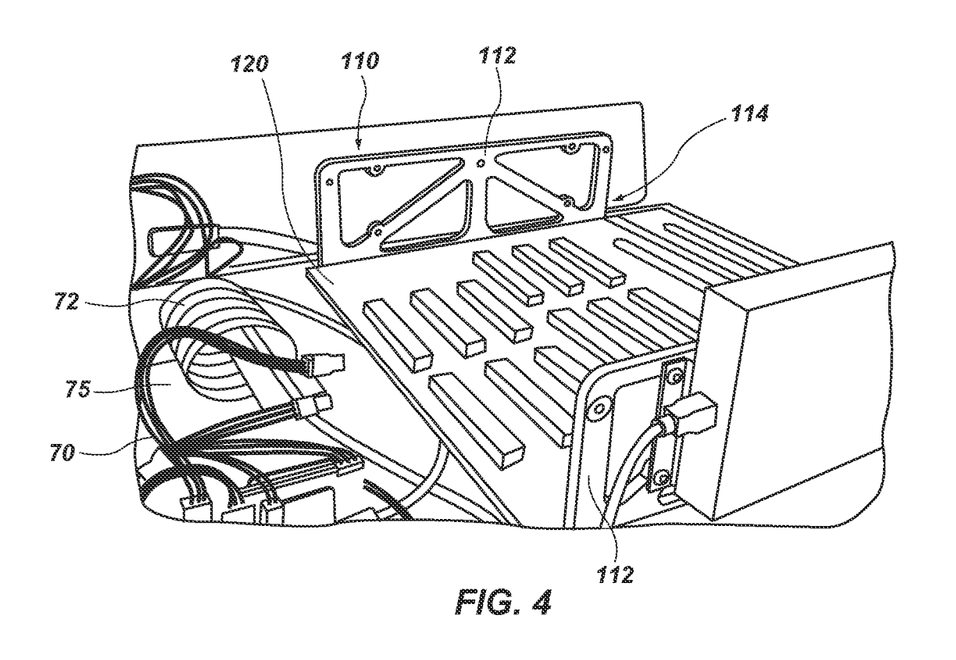
FIG. 4 depicts some of the components of the test module assembly, including an outer support, a board (e.g., a test module interface board, etc.) with connectors that establish communication between the test modules, and the computer.
Figure 5:
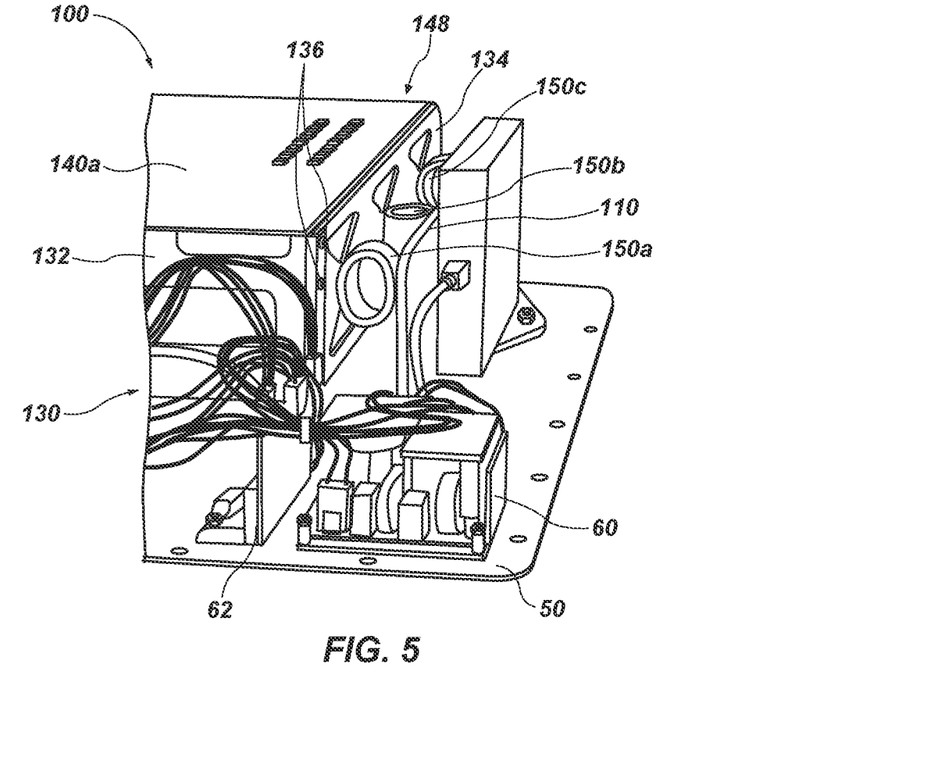
FIG. 5 shows a plurality of test module boards in a stacked arrangement, or superimposed relation to one another, and separated from each other by spacers.
Figure 6:
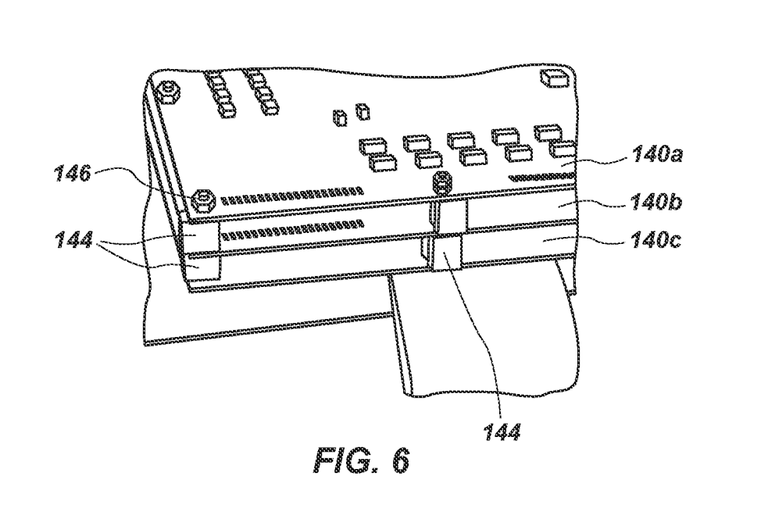
FIG. 6 depicts the plurality of test module boards shown in FIG. 5 assembled with and secured to an inner frame, as well as the inner frame assembled with and secured to the outer support shown in FIG. 4.
Figure 7:
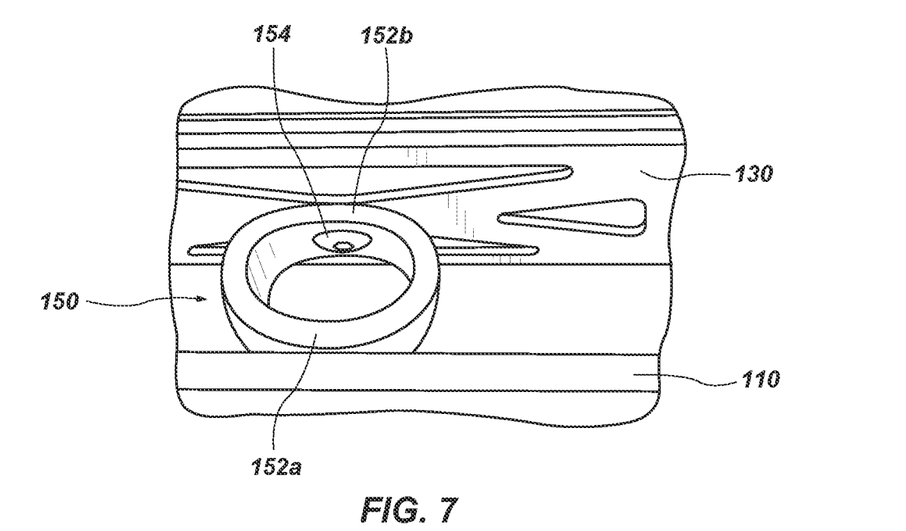
FIG. 7 illustrates the relationship between the inner frame, an embodiment of an isolator, and the outer support.

Turning now to FIGS. 4-7, some of the components of an embodiment of the test module assembly 100 are shown. Specifically, as shown in FIG. 4, the test module assembly 100 may include an outer support 110 and one or more circuit boards, such as the test module interface board 120 shown in FIG. 4, carried by the outer support 110. In addition, the test module assembly 100 may include an inner frame 130, such as that shown in FIG. 5. The inner frame 130 carries one or more test module boards 140a, 140b, 140c, etc. (each a test module board 140; collectively, test module boards 140), such as those shown in FIG. 6. With an inner frame assembly 148 that includes the inner frame 130 and the test module boards 140 carried thereby positioned within the outer support 110, a plurality of isolators 150a, 150b, 150c, etc. (each an isolator 150; collectively, isolators 150) may be positioned between the inner frame 130 and the outer support 110 to secure the inner frame 130 to the outer support 110, as shown in FIGS. 5 and 7.

As shown in FIG. 4, the outer support 110 of the test module assembly 100 may include upwardly protruding support elements 112. The support elements 112 may be arranged and oriented to define a receptacle 114. For example, each support element 112 of the outer support 110 may be oriented perpendicular to and protrude from the thermally conductive plate of the chassis 50. The outer support 110 may be rigidly secured to the chassis 50; for example, with welds or with fasteners, such as screws or bolts, that may provide stronger connections than welds. In a specific embodiment, each support element 112 of the outer support 110 may have a structure (e.g., include an arrangement of rigidity enhancing features, such as flanges, ribs, and/or gussets, etc.) and/or be formed from a material (e.g., steel, stainless steel, aluminum, etc.) that enhances its rigidity. The outer support 110 may also include coupling features 118 (e.g., helically threaded apertures, etc.) that enable the isolators 150 to be connected to it.

The test module interface board 120 of the test module assembly 100 may be located within the receptacle 114 defined by the outer support 110. The test module interface board 120 may include connectors 122 that establish communication between the test modules carried by the test module boards 140a, 140b, 140c, etc. (FIG. 6) and the computer 70 (e.g., by way of the ribbon connector 72 between the computer 70 and the test module interface board 120.

Referring to FIG. 5, the inner frame 130 of the test module assembly 100 may also comprise a rigid structure. Elements 132, 134, etc., of the inner frame 130 may be secured together in a rigid manner. For example, fasteners 136, such as screws or bolts, may be used to secure the elements 132, 134, etc., of the inner frame 130 to each other. The elements 132, 134, etc., of the inner frame 130 and the inner frame 130 itself may have structures (e.g., include an arrangement of rigidity enhancing features, such as flanges, ribs, and/or gussets, etc.) and/or be formed from materials (e.g., steel, stainless steel, aluminum, etc.) than enhance their rigidity. A configuration of the inner frame 130 may also facilitate the transfer of heat away from the test modules and the test module boards 140 (FIG. 6). The inner frame 130 may include coupling features 138 (e.g., helically threaded apertures, etc.) that enable the isolators 150 to be connected to it.

With reference to FIG. 6, test module boards 140a, 140b, 140c are shown. The test module boards 140 may be superimposed relative to one another in a stacked arrangement to define an inner frame assembly 148.

Spacers 144 may separate adjacent test module boards 140 from each other. Each spacer 144 may have a rigid structure (e.g., it may comprise a prismatic block of material with a square cross-section, taken transverse to its longitudinal axis, etc.). Each spacer 144 may comprise a rigid material that is not likely to damage or will not damage the test module boards or other boards of the inner assembly. Polycarbonates and other polymers may be used as the spacers 144.

Spacers 144 may separate adjacent test module boards 140 from each other, but rigidly secure them to each other. The spacers 144 may be positioned at corners 140c of the test module boards 140 and at intermediate locations around the periphery 140p of the test module boards. In some embodiments, no spacers 144 may be positioned between the middle portions, or central portions, of adjacent, stacked test module boards 140; such an arrangement may enable the middle portions of the test module boards 140 to flex, or "pant," when impacts or other forces are applied to the inner frame assembly 148.

In embodiments where an inner frame assembly 148 includes more than two superimposed test module boards 140, the spacers 144 between one adjacent pair of test module boards 140 may be aligned with the spacers 144 between each other adjacent pair of test module boards 140.

The inner frame assembly 148 may be secured together with fasteners 146, such as the depicted nuts and bolts, that extend through each aligned set, or column, of spacers 144, as well as portions of the test module boards 140 that are in contact with the spacers 144. The test module boards 140 may be assembled with one another and with the inner frame 130 in a manner that enhances the rigidity and/or the impact-resistance of an inner frame assembly 148 of the test module assembly 100. As an example, the inner frame 130 may at least partially surround an outer periphery of a plurality of test module boards 140 that are superimposed, or stacked, relative to one another in a spaced apart relation to each other. The test module boards 140 of the inner frame assembly 148 may be rigidly secured to the inner frame 130.

An arrangement in which the spacers 144 are only placed at peripheral locations and the spacers 144 and test module boards 140 are rigidly secured to one another provides an outwardly directed, or peripherally directed, tension in the boards, which may counteract panting in each test module board 140. The rigid structure of the inner frame assembly 148 may limit movement of the test module boards 140 relative to one another (i.e., movement between the boards) and minimize or even eliminate the stresses that external forces may place on the electrical connections of the test module assembly 100.

With returned reference to FIG. 5, the inner frame assembly 148 may be assembled with and secured to the outer support 110. Isolators 150 may be used to secure the inner frame 130 of the inner frame assembly 148 to the outer support 110. FIG. 5 depicts an embodiment in which the isolators 150 comprise tubular elements formed from an elastomeric polymer. A longitudinal axis of each isolator 150 may be aligned substantially parallel to the opposed surfaces of the outer support and inner frame between which the isolator 150 is positioned. FIG. 7 provides a closer view of the inner frame 130, an isolator 150, and the outer support 110. One wall 152a of the isolator 150 may be secured to the outer support 110. For example, a screw, a bolt, or another fastener 154 may extend through the wall 150a and engage the outer support 110. Another, opposite wall 152b of the isolator 150 may be independently secured to the inner frame 130. For example, a screw, a bolt, or another fastener 154 may extend through the wall 152b and engage the inner frame 130.

Figure 8:
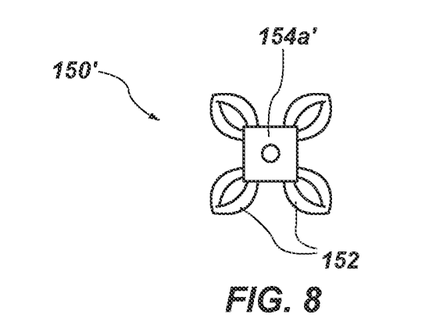
FIGS. 8 and 9 respectively provide top and side views of another embodiment of isolator that may be used to secure an inner frame to an outer support.
Figure 9:
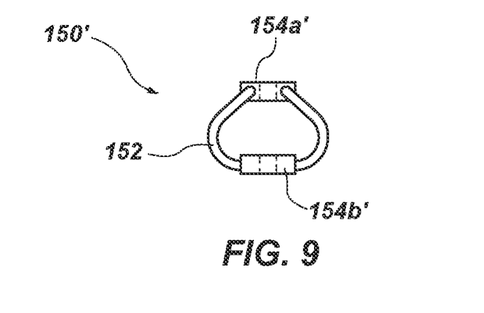

FIGS. 8 and 9 illustrate an alternative embodiment of isolator 150'. The isolator 150' may have a so-called "square wire rope" configuration, which may include an arrangement of flexible wire rope elements 152' that are secured to and positioned between a pair of mounting plates 154a' and 154b'. Such an isolator 150' is available from The VMC Group of Bloomingdale, N.J., as the Model JSQ 5-100-T2 square wire rope isolator. Such an isolator 150' may provide all-axes isolation in any orientation. One mounting plate 154a' may be secured to the outer support 110 (FIG. 5). For example, a screw, a bolt, or another fastener may extend through and engage the mounting plate 154a' and the outer support 110. The other mounting plate 154b' may be independently secured to the inner frame 130 (FIG. 5). For example, a screw, a bolt, or another fastener may extend through and engage the mounting plate 154b' and the inner frame 130.

Some of the isolators 150, 150' may be oriented parallel to the orientations of the test module boards 140 (e.g., isolators 150a and 150c in FIG. 5), while other isolators 150, 150' may be oriented perpendicular to the orientations of the test module boards 140 (e.g., isolator 150b in FIG. 5).

The isolators 150, 150' may non-rigidly secure the inner frame 130 and the inner assembly 148 of the test module assembly 100 to the outer support 110 of the test module assembly 100 and, in some embodiments, to the chassis 50 and/or the enclosure 20 (FIG. 1) of the portable diagnostic system 10 (FIG. 1). Each isolator 150, 150' may support the inner frame assembly 148 in a suspended arrangement within the outer support 110. Each isolator 150, 150" may have a configuration that enables it to attenuate, or dampen, shock waves resulting from impacts on the exterior of the enclosure and the rigid connections between the chassis and the outer support of the test module assembly (e.g., high frequency shock waves, etc.). Thus, the isolators 150, 150" may limit the communication of shock waves to the test module boards 140, the test modules carried by the test module boards 140, and connections of the inner frame assembly 148.

Each isolator 150, 150', as well as the distances between the outer surfaces of the inner frame assembly 148 and inner surfaces of the outer support 110, the chassis 50, and the cover 38 that oppose, or face, the outer surfaces of the inner frame assembly 148, may enable the inner frame assembly 148 to travel in any direction within the receptacle 114 of the outer support 110. In a specific embodiment, the isolators 150, 150' may be positioned and/or configured to enable the inner frame assembly 148 to travel a predetermined distance (e.g., 0.2 inch (0.5 cm), 0.4 inch (1 cm), 0.6 inch (1.5 cm), 0.8 inch (2 cm), etc.) in any direction within the receptacle 114 defined by the outer support 110. The outer surfaces of the inner frame assembly 148 and the opposed inner surfaces of the outer support 110, the chassis 50, and the cover 38 may be spaced apart from each other by a distances that exceed the predetermined travel distance, which may enable the isolators 150, 150' to limit or prevent impacts between the inner frame assembly 148 and the outer support 110.

The rigid manner in which the inner frame assembly 148 is formed and the flexibility between the inner frame assembly 148 and the outer support 110 may enable the test module assembly 100 to absorb forces applied thereto, including, without limitation, forces that may be generated as the enclosure 20 (FIG. 1) experiences impacts with other objects (e.g., as it is dropped, as other objects slide against it or fall on it, etc.), while isolating the delicate electronic components and features of the test module assembly 100 from those forces. These delicate electronic components and features may include the test module boards 140, the connections between the test module boards 140 and the test modules, the test modules themselves, and the connections between the test module boards 140 and the test module interface board 120, and the ribbon connectors (not shown) that extend from the test module interface board 120 to the diagnostic connectors 39 (FIG. 1).

As an example, the test module assembly 100 may absorb impacts and other forces in a manner that limits the gravitational force equivalents, or g-forces (go), experienced by its test module interface board 120, test module boards 140, the test modules, and connections to non-damaging levels (i.e., g-forces that these delicate components and features are known to be able to withstand). The test module assembly 100 may be capable of absorbing absorb impacts and other forces that generate a g-force of 20 go or more, while the delicate components and features of the test module assembly 100 experience a g-force of about 10 go or less. In a specific embodiment, a configuration of the test module assembly 100 may enable the portable diagnostic system 10 (FIG. 1) experience g-forces of up to 20 go while limiting the g-forces experienced by the delicate electronic components and features of the test module assembly to experience a g-force of 10 go or less. In such an embodiment, the delicate electronic components and features of the test module assembly 100 may be able to withstand repeated drops of the portable diagnostic system 10 from a height of up to four (4) feet.

Noise generated by the portable diagnostic system 10 (FIG. 1) may be minimized, substantially eliminated (e.g., by eliminating all ribbon connectors, leads, and other intermediate conductive elements as sources of noise, etc., while one or more electronic components may continue to generate noise) in a variety of ways. As an example, minimizing the number of noise-generating electronic components may reduce the overall level of noise produced by the portable diagnostic system, as may the selection of electronic components (e.g., a power supply 60, etc.) that generate little or no noise, or that are substantially noise free. As another example, the lengths of all of the power leads and ribbon connectors (e.g., ribbon connector 72, the ribbon connectors between the test module interface board 120 and the diagnostic connectors 39 (FIG. 1), etc.) of the portable diagnostic system 10 may be minimized. The length of each lead and/or ribbon connector may be short enough to prevent it from acting as a quarter wavelength antenna, which may reduce edges in waveforms of the signals transmitted by the leads and/or conductive elements of the ribbon connectors, and, therefore, may eliminate the generation and/or transmission of noise, or EMI. Each ribbon connector of the portable diagnostic system may have a length of about 4 inches (10.2 cm) or less or even a length of about 3 inches (7.6 cm) or less. The electronic components of the portable diagnostic system 10 may be oriented and arranged in a manner that minimizes the length of each ribbon connector, and which may minimize the collective lengths of all of the ribbon connectors. Additionally, the electronic components of the portable diagnostic system 10 may be oriented and arranged in a manner that provides for direct connections between electronic components, and, thus, eliminates the need for folding any ribbon connector at a non-straight angle, such as a right angle or an approximate right angle, etc.).

Although the foregoing description provides many specifics, these should not be construed as limiting the scopes of any of the appended claims, but merely as providing information pertinent to some specific embodiments that may fall within the scopes of the appended claims. Features from different embodiments may be employed in combination. In addition, the scopes of the appended claims may encompass other embodiments. All additions to, deletions from, and modifications of the disclosed subject matter that fall within the scopes of the claims are to be embraced by the claims.

What is claimed:

1. A portable diagnostic system for detecting intermittent faults in an electrical system, comprising:
   an enclosure including a base and a lid;
   a chassis carried by the base of the enclosure; and
   electronic components carried by the chassis, including:
      a power supply;
      a computer; and
      a test module assembly connectable with an electrical system to facilitate simultaneous and continuous testing of a plurality of circuits of the electrical system for intermittent faults, the test module assembly including:
         a plurality of test module boards positioned in superimposed relation to one another, each test module board of the plurality of test module boards carrying at least one test module;
         a plurality of spacers positioned between each adjacent pair of test module boards of the plurality of test module boards;
         a plurality of fasteners rigidly securing the plurality of test module boards together, each fastener of the plurality of fasteners extending through a spacer of the plurality of spacers and portions of the adjacent pair of test module boards at ends of the spacer;
         an internal frame surrounding and rigidly secured in place relative to the plurality of test module boards;
         an outer support positioned adjacent to and spaced apart from opposite sides of the internal frame; and
         a plurality of isolators securing the internal frame to the outer support, each isolator of the plurality of isolators enabling the internal frame to move relative to the outer support.

2. The portable diagnostic system of claim 1, wherein the plurality of test module boards includes at least three test module boards.

3. The portable diagnostic system of claim 2, wherein:
   the plurality of spacers includes a plurality of first spacers between a first test module board of the plurality of test module boards and second test module board of the plurality of test module boards;
   the plurality of spacers includes a plurality of second spacers between the second test module board of the plurality of test module boards and a third test module board of the plurality of test module boards; and
   the plurality of first spacers and the plurality of second spacers are aligned with each other.

4. The portable diagnostic system of claim 3, wherein each fastener extends through the first test module board, a first spacer of the plurality of first spacers, the second test module boards a second spacer of the plurality of second spacers, and the third test module board to rigidly secure aligned portions of the first test module board, the first spacer, the second test module board, the second spacer, and the third test module board to one another.

5. The portable diagnostic system of claim 1, wherein every spacer of the plurality of spacers is positioned adjacent to a periphery of the plurality of test module boards.

6. The portable diagnostic system of claim 5, wherein no spacer is positioned adjacent to a central portion of any of the plurality of test module boards.

7. The portable diagnostic system of claim 1, wherein elements of the internal frame are rigidly secured to one another with fasteners.

8. The portable diagnostic system of claim 1, wherein the outer support is rigidly secured to the chassis with fasteners.

9. The portable diagnostic system of claim 1, wherein each isolator of the plurality of isolators enables the inner frame to move in any direction relative to the outer support.

10. The portable diagnostic system of claim 9, wherein the plurality of isolators enables the inner frame to move about 1 cm in any direction relative to the outer support.

11. The portable diagnostic system of claim 1, wherein each isolator of the plurality of isolators comprises an elastomeric tube.

12. The portable diagnostic system of claim 1, wherein each isolator of the plurality of isolators comprises a square wire rope isolator.

\* \* \* \* \*